(12) United States Patent
Thinakaran

(10) Patent No.: US 9,252,792 B2
(45) Date of Patent: Feb. 2, 2016

(54) TUNABLE FREQUENCY-TO-VOLTAGE CONTROLLED OSCILLATION

(71) Applicant: Texas Instruments Incorporated, Dallas, TX (US)

(72) Inventor: Rajavelu Thinakaran, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/275,861

(22) Filed: May 12, 2014

(65) Prior Publication Data

US 2015/0326231 A1   Nov. 12, 2015

(51) Int. Cl.
*H03L 7/02* (2006.01)
*H03L 7/099* (2006.01)
*H03L 7/06* (2006.01)
*H03L 7/10* (2006.01)

(52) U.S. Cl.
CPC ............ *H03L 7/0991* (2013.01); *H03L 7/02* (2013.01); *H03L 7/06* (2013.01); *H03L 7/099* (2013.01); *H03L 7/105* (2013.01); *H03L 2207/00* (2013.01)

(58) Field of Classification Search
CPC ........... H03L 7/02; H03L 7/0991; H03L 7/06; H03L 7/105; H03L 7/099; H03L 2207/00
USPC ............. 331/1 R, 17, 18, 34, 111, 143, 175, 331/177 R, 25
See application file for complete search history.

(56) References Cited

U.S. PATENT DOCUMENTS

| | | | |
|---|---|---|---|
| 5,889,486 A * | 3/1999 | Opris et al. .................... | 341/150 |
| 6,967,514 B2 * | 11/2005 | Kizer et al. .................... | 327/175 |
| 2007/0132626 A1 * | 6/2007 | Hurrell ......................... | 341/155 |
| 2011/0057731 A1 * | 3/2011 | Youssef et al. .................. | 331/10 |
| 2012/0280730 A1 * | 11/2012 | Obkircher et al. ............ | 327/157 |

* cited by examiner

*Primary Examiner* — Richard Tan
(74) *Attorney, Agent, or Firm* — John R. Pessetto; Frank D. Cimino

(57) ABSTRACT

A tunable DCO (digitally controlled oscillator), for example, includes a clock generator that is arranged to provide a converter clock signal for driving a frequency-to-voltage (F2V) converter. The F2V converter, for example, includes a frequency target control input for selecting an operational frequency and in response generates a frequency control signal using a DAC (digital-to-analog converter). The example F2V converter is arranged using a split capacitor DAC to provide a linear voltage response over a range of trim codes. The clock generator is arranged to generate the converter clock signal in response to the frequency control signal.

12 Claims, 4 Drawing Sheets

TUNABLE FREQUENCY-TO-VOLTAGE CONTROLLED OSCILLATION

BACKGROUND

Electronic circuits are designed using increasingly smaller design features to attain increased integration and reduced power consumption. An example of such electronic circuits includes digitally controlled oscillators that are formed using logic circuitry used to control, for example, analog components formed on increasingly integrated circuits. Oftentimes, applications require cost-effective solutions to meet design parameters such as minimized layout area and power consumption in addition to meeting application-specific requirements such as frequency ranges and stability. As the design features of integrated circuits are increasingly made smaller, the increased integration of the electronic circuits increasingly requires using oscillators that are able to meet and exceed increasingly strict standards.

SUMMARY

The problems noted above can be solved in large part by a digitally controlled oscillation system and method. A tunable DCO (digitally controlled oscillator), for example, includes a clock generator that is arranged to provide a converter clock signal for driving a frequency-to-voltage (F2V) converter. The F2V converter, for example, includes a frequency target control input for selecting a target operational frequency and in response generates a frequency control signal using a DAC (digital-to-analog converter). The clock generator is arranged to generate the converter clock signal in response to the frequency control signal.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion. The term "calibration" can include the meaning of the word "test." The term "input" can mean either a source or a drain (or even a control input such as a gate where context indicates) of a PMOS (positive-type metal oxide semiconductor) or NMOS (negative-type metal oxide semiconductor) transistor.

Figure 1:
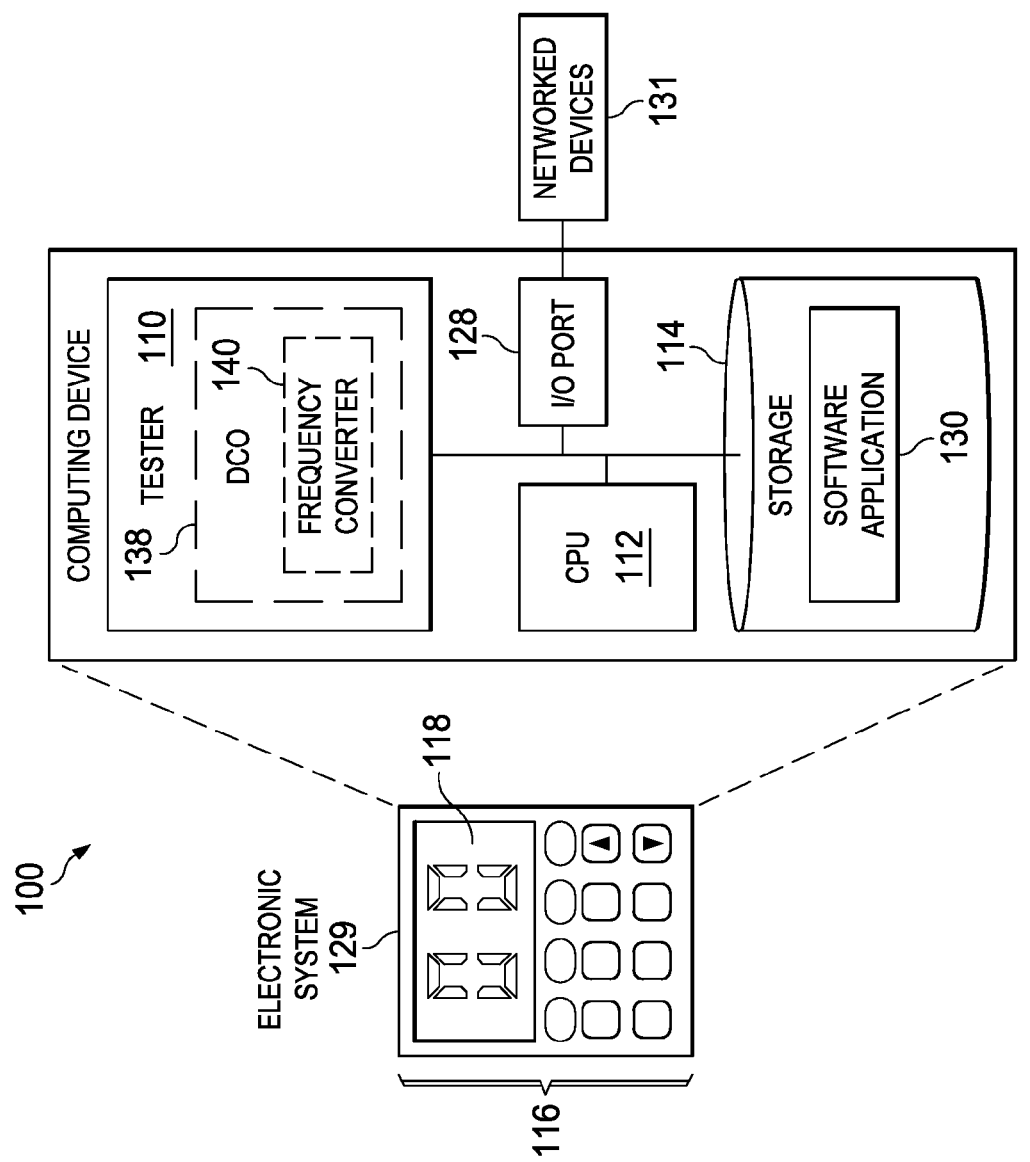
FIG. 1 shows an illustrative electronic device in accordance with example embodiments of the disclosure.

FIG. 1 shows an illustrative computing device 100 in accordance with preferred embodiments of the disclosure. For example, the computing device 100 is, or is incorporated into, an electronic system 129, such as a computer, electronics control "box" or display, communications equipment (including transmitters), or any other type of electronic system arranged to generate radio-frequency signals.

In some embodiments, the computing device 100 comprises a megacell or a system-on-chip (SoC) which includes control logic such as a CPU 112 (Central Processing Unit), a storage 114 (e.g., random access memory (RAM)) and a power supply 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, and the like. The input is received using audio and/or video inputs (using, for example, voice or image recognition), and electrical and/or mechanical devices such as keypads, switches, proximity detectors, gyros, accelerometers, and the like. The CPU 112 and power supply 110 is coupled to I/O (Input-Output) port 128, which provides an interface that is configured to receive input from (and/or provide output to) networked devices 131. The networked devices 131 can include any device (including test equipment) capable of point-to-point and/or networked communications with the computing device 100. The computing device 100 can also be coupled to peripherals and/or computing devices, including tangible, non-transitory media (such as flash memory) and/or cabled or wireless media. These and other input and output devices are selectively coupled to the computing device 100 by external devices using wireless or cabled connections. The storage 114 can be accessed by, for example, by the networked devices 131.

The tester 110 comprises logic that supports calibration, testing, and debugging of the computing device 100 executing the software application 130. For example, the tester 110 can be used to emulate a defective or unavailable component(s) of the computing device 100 to allow verification of how the component(s), were it actually present on the computing device 100, would perform in various situations (e.g., how the component(s) would interact with the software application 130). In this way, the software application 130 can be debugged in an environment which resembles post-production operation.

The tester 110, for example, includes a DCO (digitally controlled oscillator) 138 that includes an F2V (frequency-to-voltage) converter 140. Although the F2V converter 140 is illustrated as being included in the tester 110, the F2V converter 140 can be included in the same substrate (e.g., as provided by a die as produced in semiconductor) or a different substrate as the DCO 138.

The CPU 112 and tester 110 are coupled to I/O (Input-Output) port 128, which provides an interface that is configured to receive input from (and/or provide output to) peripherals and/or computing devices 131, including tangible (e.g., "non-transitory") media (such as flash memory) and/or cabled or wireless media (such as a Joint Test Action Group (JTAG) interface). These and other input and output devices are selectively coupled to the computing device 100 by external devices using wireless or cabled connections. The CPU 112, storage 114, and tester 110 are also coupled to a power supply (not shown), which is configured to receive power from a power source (such as a battery, solar cell, "live" power cord, inductive field, fuel cell, and the like).

As discussed below with reference to the following figures, the DCO 138 is arranged, for example, to provide a tunable frequency output that can be tuned from 1 MHz to 48 MHz in 0.1% steps. The tuning of the tunable frequency output is linear within a, for example, least significant bit of a tuning code so that the user can easily predict the actual DCO 138 frequency that is output in response to a given tuning code. To meet the low power targets, and a large frequency range, the DCO 138 can be arranged having smaller sub-ranges with each range having a center frequency centered about 1.5, 3, 6, 12, 24, and 48 MHz frequencies. The various sub-ranges can overlap adjacent sub-ranges to help ensure "seamless" overlap between sub-ranges.

A tuning code can be selected and transmitted to the DCO by a processor such as CPU 112. The tuning code used to select a frequency in an overlapping region where the tuning code can be mapped or otherwise modified to select the control information of either of the two adjacent sub-ranges. As discussed below, the control information includes information such as which one or more individual capacitors in a capacitor bank are to be selected, the value of a (and/or which) discharge transistor to be used to discharge the selected transistors of the capacitor bank, and the current used to drive the oscillator unit of the DCO 138.

Figure 2:
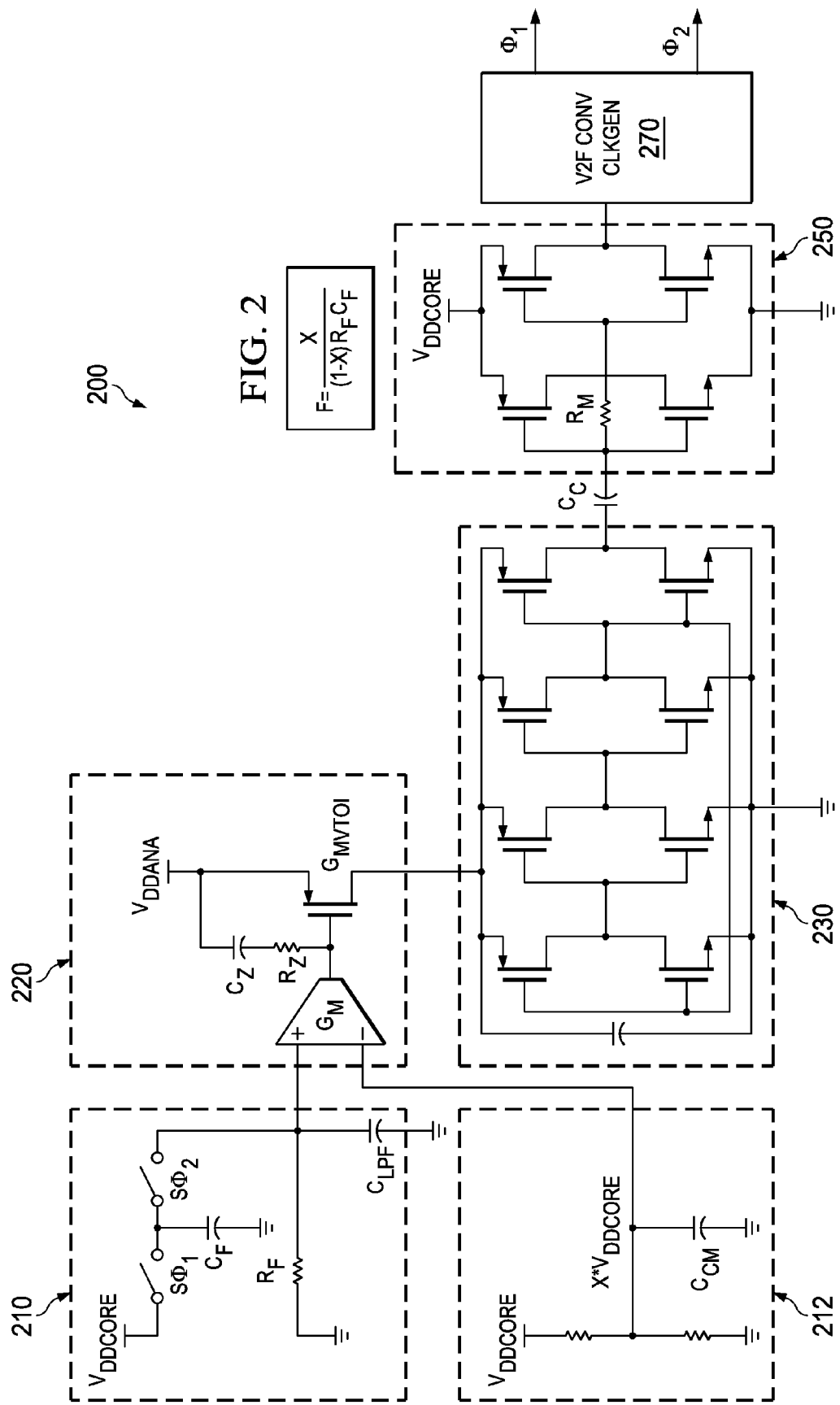
FIG. 2 is a schematic diagram illustrating a tunable digitally controlled oscillator in accordance with example embodiments of the disclosure.

FIG. 2 is a schematic diagram illustrating a tunable digitally controlled oscillator in accordance with example embodiments of the disclosure. Generally described, the DCO system 200 is arranged as a DCO such as DCO 138. DCO system 200 includes, for example, F2V (frequency-to-voltage) converter 210, reference voltage generator 212, integrator 220, oscillator 230, signal conditioner 250, and V2F converter clock generator (CLKGEN) 270.

The F2V converter 210 is arranged to receive a frequency target control input (e.g., a tuning code) for programming a capacitance value of capacitor $C_F$. Capacitor $C_F$ is typically embodied as a programmable split capacitor DAC (described below with reference to FIG. 5, for example). Switch $S\phi1$ (which is a PMOS transistor) and switch $S\phi2$ (which is an NMOS transistor) operate respectively in response to the signals $\phi1$ and $\phi2$ that are output by clock generator 270. Capacitor $C_F$ typically includes a bank of capacitors from which one or more individual capacitors are selected in response to the frequency target control input such that the capacitance of $C_F$ is selectively programmable.

The output of switch $S\phi2$ is frequency control signal that is low-pass filtered by a filter that formed by an arrangement of capacitor $C_{LPF}$ and resistor $R_F$. The low pass filter reduces ripple in the frequency control signal that is provided to a positive input of integrator 220. The frequency control signal determines an output frequency "f" in accordance with the equation:

$$f = \frac{X}{(1-X)R_F C_F} \quad (1)$$

where X is a voltage divider ratio (such as discussed below with regards to reference voltage generator 212).

The reference voltage generator 212 is arranged to generate a ratio "X" that is a fraction of the supply voltage $V_{DDCORE}$ using two resistors configured as a voltage divider between supply voltage $V_{DDCORE}$ and ground. The ratio X is used to generate a converter reference voltage having a voltage of $X*V_{DDCORE}$. The converter reference voltage is low-pass filtered (e.g., against noise) by capacitor $C_{CM}$ (capacitor common mode) that is coupled between the output of the voltage divider resistor network and ground. The filtered converter reference voltage is provided to a negative input of integrator 220.

Integrator 220 is arranged to compare the frequency control signal with the filtered converter reference voltage and, in response, to generate an integrated reference voltage using amplifier $G_M$. Amplifier $G_M$ includes positive and negative inputs that are arranged as a PMOS input folded cascade to increase rejection of power supply noise while maintaining low power consumption. Accordingly, common mode noise on the frequency control signal and the filtered converter reference voltage is minimized.

The output of amplifier $G_M$ is coupled to the control input (e.g., base) of the transistor $G_{MVTOI}$ and to the analog supply rail $V_{DDANA}$ via resistor $R_Z$ and capacitor $C_Z$. Resistor $R_Z$ and capacitor $C_Z$ to integrate the output of amplifier $G_M$ and control the amount of current supplied from the analog supply rail $V_{DDANA}$ flowing through transistor $G_{MVTOI}$ to the positive voltage supply rail of oscillator 230.

Oscillator 230 includes a self-inverting logic state that uses a series of inverters in a feedback loop. The positive voltage supply rail of oscillator 230 is decoupled (e.g., through a capacitor) with respect to the negative voltage supply rail of oscillator 230 (e.g., ground). The (e.g., degree of) input voltage applied to the positive voltage supply rail of oscillator 230 determines the frequency at which the oscillator 230 resonates. The output of the oscillator 230 is coupled (e.g., via capacitor $C_C$) to the input of signal conditioner 250.

Signal conditioner 250 is arranged to convert an edge-triggered event (e.g., an AC-coupled output signal from capacitor $C_C$) to a steady-state input. The input signal of signal conditioner 250 is conditioned by resistively coupling (e.g., via resistor $R_M$) the drains of the PMOS and NMOS transistors to the bases of the respective PMOS and NMOS transistors. The drains of the PMOS and NMOS transistors are also coupled to the bases of an output buffer formed by a PMOS and NMOS transistor coupled in series between the positive supply rail VDDCORE and ground. The output of the output buffer is coupled to the input of V2F converter clock generator (V2F CONV CLKGEN) 270.

V2F converter clock generator 270 is arranged to output a two-phase output clock signal in response to the output of signal conditioner 250. The two-phase output clock signal includes a first phase signal (e.g., signal $\phi 1$) having a duty cycle of 50 percent, where the first portion of a cycle includes a high (e.g., logic one) portion and the second portion of the cycle includes a low (e.g., logic zero) portion. The two-phase output clock also includes a second phase signal (e.g., signal $\phi 2$) having a duty cycle of 50 percent, where the first portion of a cycle includes a low (e.g., logic zero) portion and the second portion of the cycle includes a high (e.g., logic one) portion. The two-phase output clock signal is coupled to the switches S$\phi 1$ and S$\phi 2$ of F2V converter 210. Accordingly, a feedback loop is created where the output of the F2V converter 210 is (at least partially) controlled by the two-phase output clock of V2F converter clock generator 270. As discussed above, the feedback loop is created because the output of the F2F converter 210 (e.g., indirectly) controls the output frequency of the oscillator 230 used to drive the V2F converter clock generator 270, which generates the signal (gland signal $\phi 2$ that are input to the F2V converter 210.

Figure 3:
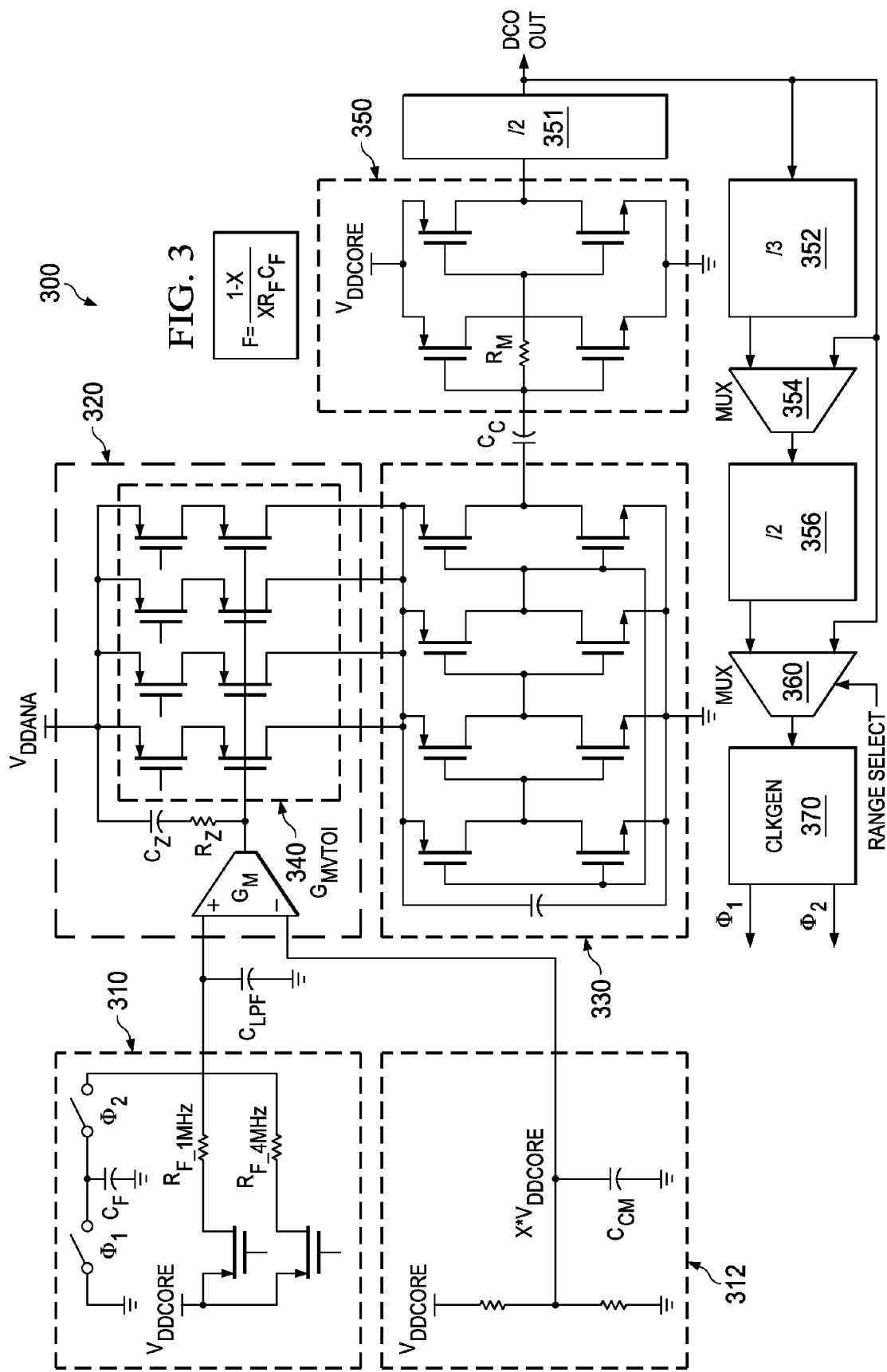
FIG. 3 is a schematic diagram illustrating a two-frequency range tunable digitally controlled oscillator in accordance with example embodiments of the disclosure.

FIG. 3 is a schematic diagram illustrating a two-frequency range tunable digitally controlled oscillator in accordance with example embodiments of the disclosure. Generally described, the DCO system 300 is arranged as a DCO such as DCO 138. DCO system 300 includes, for example, F2V (frequency-to-voltage) converter 310, reference voltage generator 312, integrator 320, oscillator 330, signal conditioner 350, and V2F converter clock generator (CLKGEN) 370.

The F2V converter 310 is arranged to receive a frequency target control input for programming a capacitance value of capacitor $C_F$. Capacitor $C_F$ is typically embodied as a programmable split capacitor DAC (described below with reference to FIG. 5, for example). Switches S$\phi 1$ (which is a PMOS transistor) and S$\phi 2$ (which is an NMOS transistor) operate respectively in response to the signals $\phi 1$ and $\phi 2$ that are output by clock generator 370.

The output of switch S$\phi 2$ is frequency control signal that is low-pass filtered by a filter that formed by an arrangement of capacitor $C_{LPF}$ and one (or more) of resistor $R_{F\_1MHZ}$ and resistor $R_{F4MHZ}$. Resistor $R_{F\_1MHZ}$ and resistor $R_{F4MHZ}$ are individually selectable (e.g., by transistors individually or collectively selected by a selector 560 described below) in accordance with a frequency range in (and/or tuning code for) which the DCO 300 is to operate. The low pass filter reduces ripple in the frequency control signal that is provided to a positive input of integrator 320. The frequency control signal determines an output frequency "f" in accordance with the equation:

$$f = \frac{1-X}{XR_F C_F} \quad (2)$$

The reference voltage generator 312 is arranged to generate a ratio "X" that is a fraction of the supply voltage $V_{DDCORE}$ using two resistors configured as a voltage divider between supply voltage $V_{DDCORE}$ and ground. The ratio X is used to generate a converter reference voltage having a voltage of $X*V_{DDCORE}$. The converter reference voltage is low-pass filtered (e.g., against noise) by capacitor $C_{CM}$ (capacitor common mode) that is coupled between the output of the voltage divider resistor network and ground. The filtered converter reference voltage is provided to a negative input of integrator 320.

Integrator 320 is arranged to compare the frequency control signal with the filtered converter reference voltage and, in response, to integrate a converter reference voltage using amplifier $G_M$. Amplifier $G_M$ includes positive and negative inputs that are arranged as a PMOS input folded cascade to increase rejection of power supply noise while maintaining low power consumption. Accordingly, common mode noise on the frequency control signal and the filtered converter reference voltage is minimized.

The output of amplifier $G_M$ is coupled to the control input (e.g., base) of the transistor $G_{MVTOI}$ and to the analog supply rail $V_{DDANA}$ via resistor $R_Z$ and capacitor $C_Z$. Resistor $R_Z$ and capacitor $C_Z$ to integrate the output of amplifier $G_M$ and control the amount of current supplied from the analog supply rail $V_{DDANA}$ flowing through transistor $G_{MVTOI}$ to the positive voltage supply rail of oscillator 330.

Transistor $G_{MVTOI}$ is arranged as a bank 340 of individually selectable transistors in parallel. Accordingly the amount of current supplied by transistor $G_{MVTOI}$ is selectable by individually or collectively enabling each branch of bank 340. Each branch can be selectively enabled by asserting a control signal at the base of a select transistor in each branch (such as each PMOS transistor that is coupled to the upper supply rail) in accordance with a frequency range in which the DCO 300 is to operate. The select transistors are selectively enabled to produce oscillation of the oscillator 330 in a frequency range that is associated with (e.g., encompasses a frequency specified by) a given tuning code. Accordingly, the select transistors can be enabled by the selector 560 as discussed below with regards to FIG. 5.

The positive voltage supply rail of oscillator 330 is decoupled (e.g., through a capacitor) with respect to the negative voltage supply rail of oscillator 330 (e.g., ground). The (e.g., degree of) input voltage applied to the positive voltage supply rail of oscillator 330 determines the frequency at which the oscillator 330 resonates. The output of the oscillator 330 is coupled (e.g., via capacitor $C_C$) to the input of signal conditioner 350.

Signal conditioner 350 is arranged to convert an edge-triggered event (e.g., an AC-coupled output signal from capacitor $C_C$) to a steady-state input. The input signal of signal conditioner 350 is conditioned by resistively coupling (e.g., via resistor $R_M$) the drains of the PMOS and NMOS transistors to the bases of the respective PMOS and NMOS transistors. The drains of the PMOS and NMOS transistors are also coupled to the bases of an output buffer formed by a PMOS and NMOS transistor coupled in series between the positive supply rail $V_{DDCORE}$ and ground. The output signal of the output buffer is coupled to the input of clock divider 351.

Clock divider 351 is arranged to divide the output signal of the signal conditioner 350 by a divisor of two (e.g., divide the frequency in half). The output of clock divider 351 is signal DCO OUT, which is coupled to the input of clock divider 352.

Clock divider 352 is arranged to divide the DCO OUT signal of the clock divider 351 by a divisor of three (e.g., divide the frequency in a third). The output of clock divider 352 is coupled to the input of multiplexer (MUX) 354. MUX 354 is arranged to select between the signal DCO OUT or the output of clock divider 352 in accordance with a frequency range in which the DCO 300 is to operate. MUX 354 operates responsively to a select signal that is generated by a frequency range selector (such as selector 560 described below). The output of MUX 354 is coupled to the input of divider 356.

Clock divider 356 is arranged to divide the DCO OUT signal of the clock divider 354 by a divisor of two (e.g., divide the frequency in half). The output of clock divider 352 is coupled to the input of multiplexer (MUX) 360. MUX 360 is arranged to select between the signal DCO OUT or the output of clock divider 354 in accordance with a frequency range in which the DCO 300 is to operate. MUX 356 operates responsively to a select signal that is generated by a frequency range selector (such as selector 560 described below). The output of MUX 356 is coupled to the input of V2F converter clock generator 370.

Accordingly, MUX 352, MUX 354, and MUX 356 can be selected to provide clock signals that are one twelfth, one-sixth, and one-half of the output of the signal conditioner 350. Running the DCO 300 at a frequency that is twice the frequency of DCO OUT helps to ensure linearity between pair of adjacent (and over the range of) trim codes used to select one operating frequency out of the range of possible operating frequencies.

V2F converter clock generator 370 is arranged to output a two-phase output clock signal in response to the output of signal conditioner 350. The two-phase output clock signal includes a first phase signal (e.g., signal φ1) having a duty cycle of 50 percent, where the first portion of a cycle includes a high (e.g., logic one) portion and the second portion of the cycle includes a low (e.g., logic zero) portion. The two-phase output clock also includes a second phase signal (e.g., signal φ2) having a duty cycle of 50 percent, where the first portion of a cycle includes a low (e.g., logic zero) portion and the second portion of the cycle includes a high (e.g., logic one) portion. The two-phase output clock signal is coupled to the switches Sφ1 and Sφ2 of F2V converter 310. Accordingly, a feedback loop is created where the output of the F2V converter 310 is (at least partially) controlled by the two-phase output clock of V2F converter clock generator 370. As discussed above, the feedback loop is created because the output of the F2F converter 310 (e.g., indirectly) controls the output frequency of the oscillator 330 used to drive the V2F converter clock generator 370, which generates the signal φ1 and signal φ2 that are input to the F2V converter 310.

Figure 4:
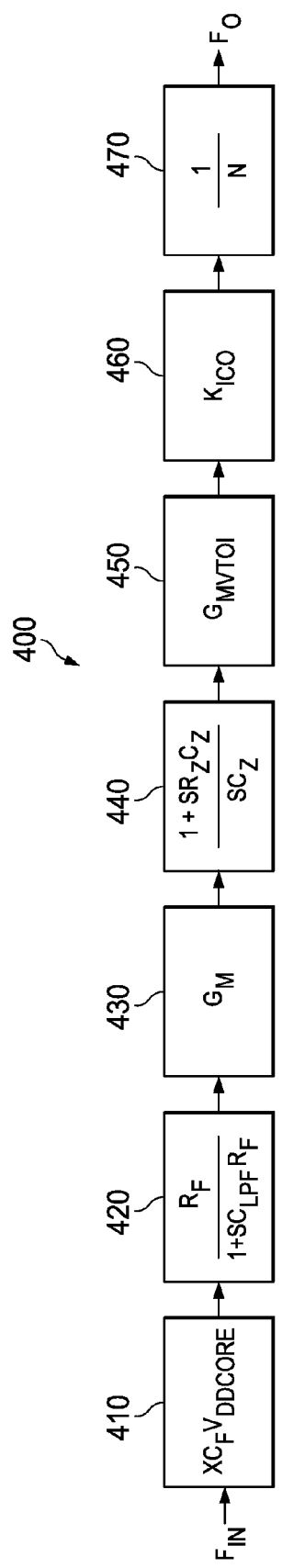
FIG. 4 is a logic diagram illustrating a stability analysis of a tunable digitally controlled oscillator in accordance with example embodiments of the disclosure.

FIG. 4 is a logic diagram illustrating a stability analysis of a tunable digitally controlled oscillator in accordance with example embodiments of the disclosure. Analysis 400 includes functions 410, 420, 430, 440, 450, 460, and 470. Because analysis of an oscillation system (such as DCO 200 or 300) includes a second-order system, analysis 400 is used to determine "zeroes" in the complex plane in order to increase stability of the operation of the oscillating system.

Function 410 is an equation in accordance with the operation of a portion of a DCO with respect to a F2V converter 210 discussed above:

$$XC_F V_{DDCORE} \quad (3)$$

where X is the resistor divider ratio, $C_F$ is the capacitance of the capacitor arranged to determine the DCO frequency, $V_{DDCORE}$ is the reference voltage (which here is the voltage of the VDD supply).

Function 420 is an equation in accordance with the operation of a portion of a DCO with respect to a F2V converter 210 discussed above:

$$\frac{R_F}{1 + sC_{LPF}R_F} \quad (4)$$

where $R_F$ and $C_{LPF}$ are arranged to form a low pass filter to reduce the ripple at the $G_M$ cell input of function 430.

Function 430 is an equation in accordance with the operation of a portion of a DCO with respect to amplifier $G_M$ discussed above:

$$G_M \quad (5)$$

where $G_M$ is the transconductance of the integrator stage such as integrator 220 as discussed above.

Function 440 is an equation in accordance with the operation of a portion of a DCO with respect to integrator 220 as discussed above:

$$\frac{1 + sR_z C_z}{sC_z} \quad (6)$$

where $C_Z$ is the integrator capacitor, and resistor $R_Z$ is selected to form a "zero" to stabilize the feedback loop of the DCO.

Function 450 is an equation in accordance with the operation of a portion of a DCO with respect to integrator 220 or 320 discussed above:

$$G_{MVTOI} \quad (7)$$

where $G_{MVTOI}$ is the transconductance of the current source (e.g., bank 340) used to drive a current controlled oscillator (ICO) such as oscillator 330.

Function 460 is an equation in accordance with the operation of a portion of a DCO with respect to a oscillator 230 and signal conditioner 250 discussed above:

$$K_{ICO} \quad (8)$$

where $K_{ICO}$ is the equivalent gain of the current controlled oscillator (ICO), which can be expressed as the ratio of the instantaneous change in frequency output to the instantaneous change in oscillator current (e.g., dF/dI).

Function 470 is an equation in accordance with the operation of a portion of a DCO with respect to a V2F CONV CLKGEN as discussed above:

$$\frac{1}{N} \quad (8)$$

where N is the frequency divisor ratio of a divider in the feedback loop of the DCO.

Accordingly the loop gain and unity gain bandwidth of the tunable digitally controlled oscillator can be expressed as follows:

$$LG(s) = C_F V_{DDCORE} \frac{R_F}{1 + sC_{LPF}R_F} G_m \frac{1 + sR_z C_z}{sC_z} G_{mvtol} K_{ico} \frac{1}{N} \quad (9)$$

$$UGB = \frac{1}{2\pi} V_{DDCORE} \frac{C_F}{C_{LPF}} G_m R_z K_{VCO} \frac{1}{N} \quad (10)$$

where LG(s) is the LaPace transform of the loop gain, UGB is the unity gain bandwidth, $G_M$ is the transconductance of integrator, $G_{MVTOI}$ is the transconductance of current source driving ICO, $K_{ICO}$ is the equivalent ICO gain, $K_{VCO}$ is $G_{MVTOI}*K_{ICO}$, $F_{IN}$ is the input frequency, and $F_O$ is the output frequency of the tunable digitally controlled oscillator.

In a first example, an operational frequency of 1 MHz is selected, a divisor of 2 is selected, a control rate of 8 MHZ/V is selected, and a value of 2.5 is selected for the product of $G_M*R_Z$. Where $G_M$ is 10 microseconds (for a given rate of power consumption), a value of 250 kilo-Ohms is determined for resistor $R_Z$. Accordingly, the UGB is determined to be 150 KHz. When the UGB is 150 KHz, a ratio of capacitor $C_F$ to capacitor $C_{LPF}$ is determined to be a ratio of 0.025. Assuming a value of 200 femto-Farads for capacitor $C_F$ (in order to maintain the given rate of power consumption), the value for resistor RF is 256 kilo-Ohms and the value for capacitor $C_{LPF}$ is 8 pico-Farads. Accordingly, a zero occurs at a frequency of 75 KHz and the value for capacitor $C_Z$ is determined in accordance with 1/(6.28*75e3*250e3), which is 8 pico-Farads.

In a second example, an operational frequency of 4 MHz is selected, a divisor of 2 is selected, a control rate of 32 MHZ/V is selected, and a value of 2.5 is selected for the product of $G_M*R_Z$. Where $G_M$ is 10 microseconds (for a given rate of power consumption), a value of 250 kilo-Ohms is determined for resistor $R_Z$. Accordingly, the UGB is determined to be 150 KHz. When the UGB is 600 KHz, a ratio of capacitor $C_F$ to capacitor $C_{LPF}$ is determined to be a ratio of 0.025. Assuming a value of 200 femto-Farads for capacitor $C_F$ (in order to maintain the given rate of power consumption), the value for resistor RF is 256 kilo-Ohms and the value for capacitor $C_{LPF}$ is 8 pico-Farads. Accordingly, a zero occurs at a frequency of 75 KHz and the value for capacitor $C_Z$ is determined in accordance with 1/(6.28*300e3*250e3), which is 2 pico-Farads.

Figure 5:
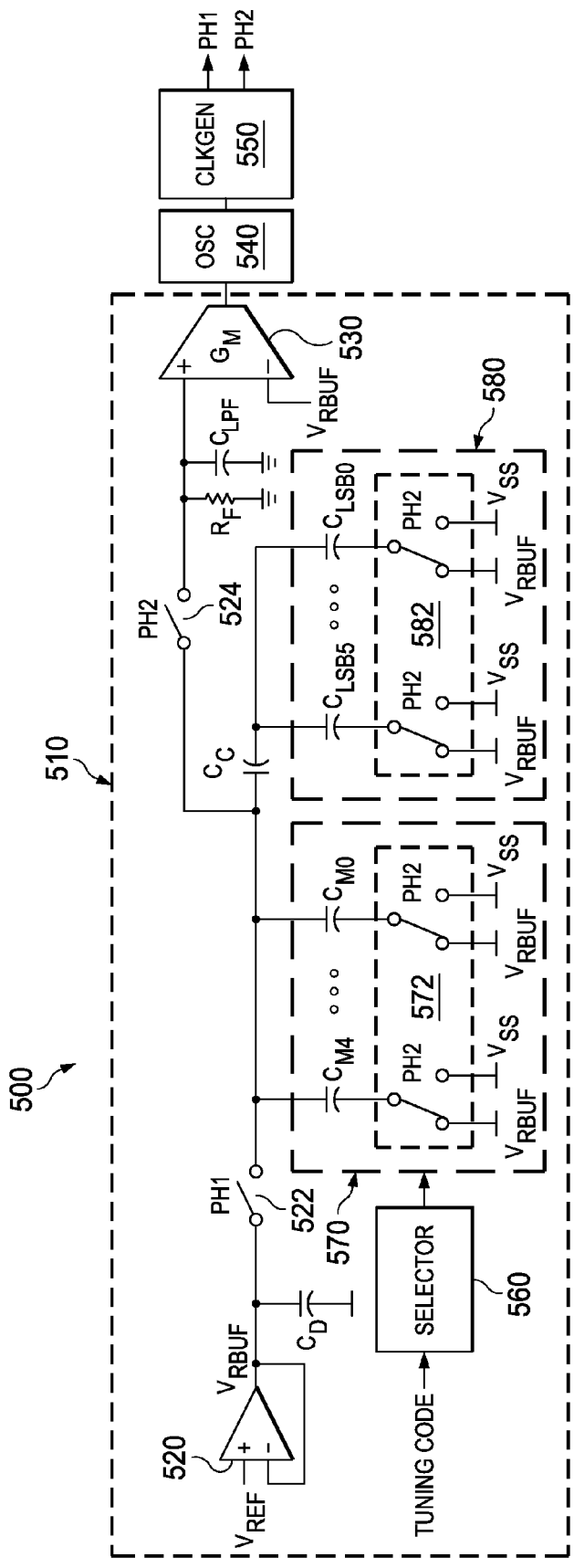
FIG. 5 is a schematic diagram illustrating a voltage-to-frequency converter of a tunable digitally controlled oscillator in accordance with example embodiments of the disclosure.

FIG. 5 is a schematic diagram illustrating a voltage-to-frequency converter of a tunable digitally controlled oscillator in accordance with example embodiments of the disclosure. Generally described, the DCO system 500 is arranged as a DCO such as DCO 138. DCO system 500 includes, for example, F2V (frequency-to-voltage) converter 510, reference voltage generator 520, switch 522, switch 524, amplifier 530, oscillator 540, clock generator (CLKGEN) 550, selector 560, split capacitor bank high 570, bridge capacitor $C_C$, and split capacitor bank low 580.

In a manner similar as described above with reference to clock generators 270 and 370, clock generator 550 is arranged to provide synchronous clock signals signal φ1 and signal φ2 for controlling switches 522 and 524 of F2V converter 510. F2V converter 510 includes split capacitor bank high 570, bridge capacitor $C_C$, and split capacitor bank low 580, which are arranged as a split-capacitor DAC.

In an embodiment, the split capacitor bank high 570 is arranged having 5 (more significant) trim code bits and the split capacitor bank low 580 is arranged having six (less significant) trim code bits. The trim code bits are derived from a tuning code received from a controller (such as CPU 112) and are stored in selector 560. The trim code bits determine which of the switches 572 and the switches 582 are coupled to the bottom plates of the capacitors of split capacitor bank high 570 and split capacitor bank low 580 during the second phase as discussed below.

The bridge capacitor $C_C$ is typically a non-integer multiple of the unit capacitance C. The bridge capacitance is determined such that $C_{LSB}5$ (e.g., which is the first capacitor illustrated to the right of the bridge capacitor $C_C$) has a weight equivalent to one half the weight of $C_M0$ (which is the last capacitor illustrated to the left of the bridge capacitor $C_C$). The bridge capacitor $C_C$ significantly reduces the total area that would otherwise be used to form the capacitors used to implement a DAC. For example, a 10-bit DAC without a bridge capacitor would have capacitive areas of 512C, 256C, 128C, . . . , 4C, 2C, and C (having a total capacitive area of 1023C). Using a 10-bit DAC arranged with a bridge capacitor; the capacitive areas would be 16C, 8C, 4C, 2C, C, bridge capacitor area, 16C, 8C, 4C, 2C, and C (having a total capacitive area of around 64C).

The operation of F2V converter 510 is performed using the two phases of the clock signals signal φ1 and signal φ2. During a first (e.g., pre-charge) phase, signal φ1 is high and signal φ2 is low. During the first phase, all of the bottom plates (e.g., as coupled by the negative terminals) of split capacitor bank high 570 and split capacitor bank low 580 are respectively coupled to ground via switches 572 and switches 582. Likewise, switch 522 is closed so that the buffered reference voltage (VRBUF) output by reference voltage generator 520 is coupled to and charges the split capacitor DAC output (e.g., at the positive terminal of the bridge capacitor C0).

During a second (e.g., conversion) phase, signal φ1 is low and signal φ2 is high. During the second phase, switch 522 is opened to disconnect the split capacitor DAC output from the buffered reference voltage (VRBUF). Likewise during the second phase, the switches 572 and 582 that are selected by a trim code of the selector 560 couple the bottom plates of the capacitors of split capacitor bank high 570 and split capacitor bank low 580 are coupled to the buffered reference voltage. For example, when the trim code indicates that all switches 572 and 582 are to be closed, the effective capacitance of the split capacitor DAC can be given as $C_M4+C_M3+C_M2+C_M1+C_M0$ plus the capacitance of $C_C$ coupled in series with each of $C_{LSB}5$, $C_{LSB}4$, $C_{LSB}3$, $C_{LSB}2$, $C_{LSB}1$, and $C_{LSB}0$.

Switch 524 is closed during the second phase so that the split capacitor DAC output is coupled to a positive terminal of amplifier 530 ($G_M$). The positive terminal of amplifier 530 ($G_M$) is coupled to ground in parallel via resistor $R_F$ and capacitor $C_F$. (Resistor $R_F$ can be trimmed during the manufacturing process to increase the accuracy of the resistor as manufactured.) Resistor $R_F$ is arranged to discharge the split capacitor DAC output during the second phase, while capacitor $C_F$ is arranged to reduce "ripple" present in the split capacitor DAC output voltage.

Accordingly, the DCO system 500 is arranged having control signals arranged in a feedback (e.g., loop) configuration. The output of amplifier 530 is an integrated control signal that is arranged to drive the oscillator 540, which in turn is used as a frequency base from which the signal φ1 and the signal φ2 are derived.

For example, the timing of the signal φ1 and signal φ2 is varied by the control loop such that the average ripple voltage of the split capacitor DAC output voltage is nearly equal to the buffered reference voltage (VRBUF) that is coupled to the negative terminal of the amplifier 530. The time period "T" is equal to the length of the active period of either signal φ1 and signal φ2 and can be expressed as follows:

$$T = RC\left(\frac{\text{code}}{2048}\right) \quad (11)$$

where "code" is a tuning code value, R is the resistance of resistor $R_F$ and C is the look-in capacitor equivalent of the split capacitor DAC that includes split capacitor bank high 570, bridge capacitor $C_C$, and split capacitor bank low 580. The value 2048 is related to a number of combinations by selectively enabling (e.g., any combination of) individual capacitors $C_M4$, $C_M3$, $C_M2$, $C_M1$, $C_M0$, $C_{LSB}5$, $C_{LSB}4$, $C_{LSB}3$, $C_{LSB}2$, $C_{LSB}1$, and $C_{LSB}0$.

The linearity of F2V converter 510 is dependent upon the linearity of the split capacitor DAC and the stability of the reference voltage generator 520. Linearity is achieved in an embodiment of the split capacitor DAC with actual capacitances being within 3.2 pico-Farads of the theoretical values over the capacitive range. The reference voltage generator 520 in an embodiment is a low-power, slow voltage buffer having a decoupling capacitor ($C_D$) at the output (e.g., before switch 522) coupled to ground. Accordingly, changes in the switching load presented to the reference voltage generator 520 (e.g., resulting from trim code changes and the finite bandwidth of the reference voltage generator 520) are compensated by the decoupling capacitor $C_D$. In an embodiment the decoupling capacitor $C_D$ is a polysilicon n-well capacitor, which has a higher capacitance density of around ten times greater than the capacitance density of a flux capacitor.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. An oscillator, comprising:
    a digital-to-analog converter that is arranged to receive a tuning code, to select one or more individual capacitors in a capacitor bank in response to the received tuning code, and to generate a frequency control signal in response to the selected one or more individual capacitors in the capacitor bank and in response to one or more phase control signals;
    an amplifier that is arranged to generate an integrated control signal in response to the frequency control signal and in response to a selected current;
    an oscillator that is arranged to generate an output frequency signal in response to the integrated control signal; and
    a clock generator that is arranged to generate the one or more phase control signals in response to the output frequency signal;
    wherein the capacitor bank is a split capacitor bank that includes a higher-weight capacitor bank, a bridge capacitor, and a lower-weight capacitor bank, wherein a first terminal of the bridge capacitor is coupled to a first terminal of each of the individual capacitors of the higher-weight capacitor bank, and wherein a second terminal of the bridge capacitor is coupled to a first terminal of each of the individual capacitors of the lower-weight capacitor bank;
    wherein the split capacitor bank is arranged to couple a voltage reference signal to the first terminal and a second terminal of each individual capacitor in the higher-weight capacitor bank during a first phase that is determined by the one or more phase control signals, to couple the voltage reference signal to the first terminal of the bridge capacitor during the first phase, and to couple the voltage reference signal to a second terminal of each individual capacitor in the lower-weight capacitor bank during the first phase.

2. The oscillator of claim 1, wherein the amplifier includes a discharge resistor that is coupled to a first terminal of the amplifier and is arranged to discharge the selected one or more individual capacitors in the capacitor bank during a second phase of the phase control signals.

3. The oscillator of claim 2, wherein the amplifier includes a filter capacitor that is coupled to a first terminal of the amplifier, a second terminal that is coupled to the voltage reference signal, and a third terminal at which the integrated control signal is output.

4. The oscillator of claim 3, wherein the amplifier is selectively arranged during the second phase to compare a voltage of the first terminal of the amplifier with a voltage of the second terminal and to generate a current control signal in response to the comparison.

5. The oscillator of claim 4, wherein the selected current is selected in accordance with the received tuning code.

6. The oscillator of claim 2, wherein the discharge resistor is selected in accordance with the received tuning code.

7. A system, comprising:
    a processor that is arranged to execute computer instructions in response to an output frequency signal,
    a digital-to-analog converter that is arranged to receive a tuning code, to select one or more individual capacitors in a capacitor bank in response to the received tuning code, and to generate a frequency control signal in response to the selected one or more individual capacitors in the capacitor bank and in response to one or more phase control signals;
    an oscillator that is arranged to generate the output frequency signal in response to the frequency control signal; and
    a clock generator that is arranged to generate the one or more phase control signals in response to the output frequency signal;
    wherein the capacitor bank is a split capacitor bank that includes a higher-weight capacitor bank, a bridge capacitor, and a lower-weight capacitor bank, wherein a first terminal of the bridge capacitor is coupled to a first terminal of each of the individual capacitors of the higher-weight capacitor bank, and wherein a second terminal of the bridge capacitor is coupled to a first terminal of each of the individual capacitors of the lower-weight capacitor bank; wherein the split capacitor bank is arranged to couple a voltage reference signal to the first terminal and a second terminal of each individual capacitor in the higher-weight capacitor bank during a first phase that is determined by the one or more phase control signals, to couple the voltage reference signal to the first terminal of the bridge capacitor during the first phase, and to couple the voltage reference signal to a second terminal of each individual capacitor in the lower-weight capacitor bank during the first phase.

8. The system of claim 7, comprising an amplifier that includes a discharge resistor that is coupled to a first terminal of the amplifier and is arranged to discharge the selected one or more individual capacitors in the capacitor bank during a second phase of the phase control signals.

9. The system of claim 8, wherein the discharge resister is selected in accordance with the received tuning code.

10. The system of claim 9, wherein the amplifier is selectively arranged during the second phase to compare a voltage at a first terminal of the amplifier with a voltage at a second terminal and to generate a current control signal in response to the comparison.

11. A method for controlling an oscillation frequency, comprising:
    receiving a tuning code associated with a target oscillation frequency;
    selecting one or more individual capacitors in a capacitor bank in response to the received tuning code;

generating a frequency control signal in response to the selected one or more individual capacitors in the capacitor bank and in response to one or more phase control signals;

generating an output frequency signal in response to the frequency control signal and in response to a selected current; and generating the one or more phase control signals in response to the output frequency signal; wherein the capacitor bank is a split capacitor bank that includes a higher-weight capacitor bank, a bridge capacitor, and a lower-weight capacitor bank, wherein a first terminal of the bridge capacitor is coupled to a first terminal of each of the individual capacitors of the higher-weight capacitor bank, wherein a second terminal of the bridge capacitor is coupled to a first terminal of each of the individual capacitors of the lower-weight capacitor bank, and wherein the split capacitor bank is arranged to couple a voltage reference signal to the first terminal and a second terminal of each individual capacitor in the higher-weight capacitor bank during a first phase that is determined by the one or more phase control signals, to couple the voltage reference signal to the first terminal of the bridge capacitor during the first phase, and to couple the voltage reference signal to a second terminal of each individual capacitor in the lower-weight capacitor bank during the first phase.

12. The method of claim 11, further comprising discharging the selected one or more individual capacitors in the capacitor bank during a second phase of the phase control signals via a discharge resistor wherein a value of the discharge resistor is selected in accordance with the received tuning code.

* * * * *